US007709922B2

(12) United States Patent
Takagi et al.

(10) Patent No.: US 7,709,922 B2
(45) Date of Patent: May 4, 2010

(54) THERMISTOR DEVICE

(75) Inventors: Hidenori Takagi, Tokyo (JP); Yoshinobu Nakamura, Tama (JP); Kouhei Fujiwara, Nishiwaki (JP)

(73) Assignees: Toudai TLO, Ltd., Bunkyo-ku, Tokyo (JP); NEC SCHOTT Components Corporation, Koka-shi, Shiga (JP)

( * ) Notice: Subject to any disclaimer, the term of this patent is extended or adjusted under 35 U.S.C. 154(b) by 516 days.

(21) Appl. No.: 10/594,341

(22) PCT Filed: Mar. 17, 2005

(86) PCT No.: PCT/JP2005/004791

§ 371 (c)(1),
(2), (4) Date: May 16, 2007

(87) PCT Pub. No.: WO2005/091311

PCT Pub. Date: Sep. 29, 2005

(65) Prior Publication Data

US 2007/0262408 A1 Nov. 15, 2007

(30) Foreign Application Priority Data

Mar. 19, 2004 (JP) ............................ 2004-079818

(51) Int. Cl.
*H01L 31/058* (2006.01)

(52) U.S. Cl. .............................. 257/467; 257/E29.347

(58) Field of Classification Search ................ 257/467, 257/470, E29.347
See application file for complete search history.

(56) References Cited

U.S. PATENT DOCUMENTS

| | | | | |
|---|---|---|---|---|
| 4,009,482 | A * | 2/1977 | Nakata | 257/108 |
| 6,337,991 | B1 * | 1/2002 | Li et al. | 505/161 |
| 6,489,613 | B1 * | 12/2002 | Mori et al. | 250/338.1 |
| 2005/0151213 | A1 * | 7/2005 | Casey et al. | 257/414 |
| 2005/0231174 | A1 * | 10/2005 | Iwatani | 322/25 |

FOREIGN PATENT DOCUMENTS

| | | | |
|---|---|---|---|
| JP | 6-058821 | A | 3/1994 |
| JP | 6-151105 | A | 5/1994 |
| JP | 8-019174 | A | 1/1996 |
| JP | 10-106806 | A | 4/1998 |
| JP | 10-340801 | A | 12/1998 |
| JP | 11-016705 | A | 1/1999 |
| JP | 2000-100603 | A | 4/2000 |

* cited by examiner

*Primary Examiner*—Allan R. Wilson
(74) *Attorney, Agent, or Firm*—Christensen O'Connor Johnson Kindness

(57) ABSTRACT

A thermistor device having a high-speed response to temperature and a large ON/OFF ratio at the operating temperature. The thermistor device comprises a first layer of a first material having a positive temperature coefficient of resistance and a second layer of a second material having a semiconductivity and formed directly on the first layer. As the first material changes from conductive to a semiconductive or an insulative at or near the transition temperature $T_{M-I}$, the interface between the first and second layer changes to a pn junction.

13 Claims, 5 Drawing Sheets

I-V characteristics of the hetero junction

Resistance-Temperature Curve of Hetero Junction (V=-3V)

THERMISTOR DEVICE

TECHNICAL FIELD

The present invention relates to a temperature sensor, infrared sensor, overcurrent preventing device, temperature control device and temperature switch, utilized for the control of electric or electronic apparatuses.

BACKGROUND ART

Conventionally, there have been suggested 1) semiconductive $BaTiO_3$ PTC thermistor devices obtained by doping a rare earth element such as La, Gd and the like into $BaTiO_3$ as a ferroelectric substance; and 2) PTC devices obtained by dispersing conductive carbon black particles as a filler in an organic polymer substance as a matrix (see, Patent Document 1) as devices manifesting a so-called "PTC (Positive Temperature Coefficient)" resistance property showing insulating property at high temperatures and conducting property at low temperatures. And, these have been used in various electric and electronic apparatuses.

These PTC devices had problems as described below: In the above item 1), resistance is too high because it is a semiconductor under low resistance condition; and in the above item 2), a principle is used in which with increase in temperature, an organic polymer as a matrix swells, thereby increasing the distance between carbon black particles as a filler, resulting that the resistance raises up at higher temperatures, and since a response to temperature changes depends on swelling of an organic polymer; thus, a high-speed response to temperature change is poor.

On the other hand, among transition metal oxides, sulfides and molecular conductors are a lot of substances which shows conductor (metal)-insulator transition triggered by temperature change. For example, $(V, M)_2O_3$ (M=transition metal element such as Cr and the like), $NiS_{2-x}Se_x$, bisethylene-dithio-tetrathiafluvalene (hereinafter, abbreviated as "BEDT-TTF" in some cases) salts and the like show such a property, namely, a PTC thermistor property. Thermistors employing these substances are expected to have excellent features such as durability, high speed operation as an electronic switch, and tuning of operating temperature from extremely low temperature to high temperature by precise control of their chemical composition. However, during rising temperature condition i) substances showing positive change in resistance are rare, and even in such a case, ii) small ON/OFF ratio at operating temperature, namely, small difference in resistance at or near operating temperature is drawback.

Patent Document 1: Japanese Patent Application Laid-Open No. 8-19174

DISCLOSURE OF THE INVENTION

Problems to be Solved by the Invention

An object of the present invention is to provide a thermistor device having a high-speed response to temperature and a high ON/OFF ratio at or near operating temperature.

Another object of the present invention is to provide a thermistor apparatus which is small in size and has a high-speed response to temperature, a variable and controllable operating temperature, and a variable and controllable ON/OFF ratio at or near operating temperature.

MEANS FOR SOLVING THE PROBLEMS

The present inventors have found that the following inventions can solve the above-described problems.

<1> A thermistor device comprising a first layer comprised of a first substance having a positive or negative temperature coefficient of resistance and a second layer comprised of a second substance having conductivity or semiconductivity and located directly on the first layer.

<2> In the above item <1>, the first substance may have a positive temperature coefficient of resistance and may have 100 mΩcm or less at operating temperature or lower.

<3> A thermistor device comprising a first layer comprised of a first substance having a positive temperature coefficient of resistance and a second layer comprised of a second substance having semiconductivity and directly located on the first layer, wherein the interface between the first and second layers changes to a pn junction, as the first substance changes from being conductive to semiconductive or insulative at or near the transition temperature $T_{M-I}$.

<4> A thermistor device comprising a first layer comprised of a first substance having a positive temperature coefficient of resistance and a second layer comprised of a second substance having conductivity and formed directly on the first layer, wherein the interface between the first and second layers changes to a schottky barrier, as the first substance changes from being conductive to semiconductive or insulative at or near the transition temperature $T_{M-I}$.

<5> In any one of the above items <1> to <4>, the first substance may be selected from substances which belong to strongly correlated electron systems.

<6> In any one of the above items <1> to <4>, the first substance may be selected from the group consisting of vanadium oxides $(V_{(1-x)}M_x)_2O_3$ (M represents Cr or Ti, $0 \leqq x \leqq 0.2$), $NiS_{(2-y)}Se_y$ ($0.5 \leqq y \leqq 1.67$), bisethylenedithio-tetrathiafluvalene (hereinafter, abbreviated as "BEDT-TTF" in some cases) salts and manganese oxides $(M'_{(1-z)}M''_z)MnO_3$ (M' represents an alkaline earth element, M" represents a rare earth element, $0 \leqq z \leqq 0.6$).

<7> In any one of the above items <1> to <6>, the first substance may be a vanadium oxide $(V_{(1-x)}M_x)_2O_3$ (M represents Cr or Ti, $0 \leqq x \leqq 0.2$). The range of x ($0 \leqq x \leqq 0.2$) may provide the thermistor device having the transition temperature $T_{M-I}$ within the range of 200 to 600 K, preferably 300 to 400 K, more preferably 340 to 370 K.

<8> In any one of the above items <1> to <7>, the second substance may be selected from the group consisting of n-type semiconductive oxides, p-type semiconductive oxides, and p- or n-type single element semiconductors.

<9> In the above item <8>, n-type semiconductive oxide may be selected from the group consisting of ZnO, In—Sn oxides (ITO), and $SrTiO_3$.

<10> In the above item <8>, p-type semiconductive oxide may be selected from the group consisting of $SrCu_2O_2$, NiO, CuO, $La_xSr_{2-x}CuO_4$ ($0<x<0.2$), and $EuTiO_3$.

<11i> In the above item <8>, p- or n-type single element semiconductor may be Si.

<12> In any one of the above items <1> to <11>, the second layer has a thickness of 1000 nm or less, preferably 100 nm or less.

<13> A thermistor apparatus comprising a thermistor device and a voltage control means for controlling voltage to be applied to the thermistor device, wherein said thermistor device comprises a first layer comprised of a first substance having a positive or negative temperature coefficient of resistance and a second layer comprised of a second substance having conductivity or semiconductivity and formed directly on the first layer.

<14> In the above item <13>, the first substance may have a positive temperature coefficient of resistance.

<15> A thermistor apparatus comprising a thermistor device and a voltage control means for controlling an applied voltage to the thermistor device, wherein said thermistor device comprises a first layer comprised of a first substance having a positive temperature coefficient of resistance and a second layer comprised of a second substance having semiconductivity and located directly on the first layer, and the interface between the first and second layers changes to a pn junction, as the first substance changes from being conductive to semiconductive or insulative at or near the transition temperature $T_{M-I}$.

<16> A thermistor apparatus comprising a thermistor device and a voltage control means for controlling an applied voltage to the thermistor device, wherein said thermistor device comprises a first layer comprised of a first substance having a positive temperature coefficient of resistance and a second layer comprised of a second substance having conductivity and located directly on the first layer, and the interface between the first and second layers changes to a schottky barrier, as the first substance changes from being conductive to semiconductive or insulative at or near the transition temperature $T_{M-I}$.

<17> In any one of the above items <13> to <16>, the first substance may be selected from substances which belong to strongly correlated electron systems.

<18> In any one of the above items <13> to <16>, the first substance may be selected from the group consisting of vanadium oxides $(V_{(1-x)}M_x)_2O_3$ (M represents Cr or Ti, $0 \leqq x \leqq 0.2$) $NiS_{(2-y)}Se_y$ ($0.5 \leqq y \leqq 1.67$), bisethylenedithio-tetrathiafluvalene (hereinafter, abbreviated as "BEDT-TTF" in some cases) salts and manganese oxides $(M'_{(1-z)}M''_z)MnO_3$ (M' represents an alkaline earth element, M" represents a rare earth element, $0 \leqq z \leqq 0.6$).

<19> In any one of the above items <13> to <18>, the first substance may be a vanadium oxide $(V_{(1-x)}M_x)_2O_3$ (M represents Cr or Ti, $0 \leqq x \leqq 0.2$). The range of x ($0 \leqq x \leqq 0.2$) may provide the thermistor device having the transition temperature $T_{M-I}$ within the range of 200 to 600 K, preferably 300 to 400 K, more preferably 340 to 370 K.

<20> In any one of the above items <13> to <19>, the second substance may be selected from the group consisting of n-type semiconductive oxides, p type semiconductive oxides, and p- or n-type single element semiconductors.

<21> In the above item <20>, n-type semiconductive oxide may be selected from the group consisting of ZnO, In—Sn oxides (ITO), and $SrTiO_3$.

<22> In the above item <20>, p-type semiconductive oxide may be selected from the group consisting of $SrCu_2O_2$, NiO, CuO, $La_xSr_{2-x}CuO_4$ ($0<x<0.2$), and $EuTiO_3$.

<23> In the above item <20>, p- or n-type single element semiconductor may be Si.

<24> In any one of the above items <13> to <23>, the second layer has a thickness of 1000 nm or less, preferably 100 nm or less.

EFFECTS OF THE PRESENT INVENTION

The present invention can provide a thermistor device having a high-speed response to temperature and a high ON/OFF ratio at or near operating temperature.

Further, the present invention can provide a thermistor apparatus which is small in size and has a high-speed response to temperature, a variable and controllable operating temperature, and a variable and controllable ON/OFF ratio at or near operating temperature.

PREFERRED EMBODIMENTS FOR CARRYING OUT THE INVENTION

The present invention will be described in detail hereinafter.

The thermistor device of the present invention comprises a first layer comprised of a first substance having a positive or negative temperature coefficient of resistance and a second layer comprised of a second substance having conductivity or semiconductivity and located directly on the first layer.

A typical constitution example of the thermistor device of the present invention is shown in FIG. 1. In FIG. 1, a thermistor device 1 comprises only a first layer 2 consisting of a first substance having a positive or negative temperature coefficient of resistance and a second layer 3 formed directly on the first layer 2.

In the thermistor device according to the present invention, the first layer may be comprised of a first substance having a positive or negative temperature coefficient of resistance, preferably, a first substance having a positive temperature coefficient of resistance.

The first substance may be selected from substances which belong to strongly correlated electron systems. Here, "substances which belong to strongly correlated electron systems" mean substance groups as systems showing a strong interaction between electrons conducted in the substance, thereby, generating metal-insulator phase transition by its effect. For example, the first substance may be selected from the group consisting of vanadium oxides $(V_{(1-x)}M_x)_2O_3$ (M represents Cr or Ti, $0 \leqq x \leqq 0.2$), $NiS_{(2-y)}Se_y$ ($0.5 \leqq y \leqq 11.67$), BEDT-TTF salts, and manganese oxides $(M'_{(1-z)}M''_z)MnO_3$ (M' represents an alkaline earth element, M" represents a rare earth element, $0 \leqq z \leqq 0.6$), preferably is a vanadium oxide $(V_{(1-x)}M_x)_2O_3$ (M represents Cr or Ti, $0 \leqq x \leqq 0.2$). These substances may be sintered bodies (polycrystalline substances) or single crystals, and the form thereof is not limited. In the first layer, its thickness exerts little influence on the property, and the thickness may be 1000 nm or less for suppressing power loss in the device.

The first substance can be prepared by a conventional method, for example, an arc melting process. A single crystal of the first substance can be prepared by a chemical vapor transport method. Here, "chemical vapor transport method" is a method in which a polycrystalline powder of the first substance is enclosed in a quartz tube and the like under vacuum together with a transporting agent such as tellurium chloride ($TeCl_4$) and the like, and temperature gradient is applied, to obtain a single crystal of the first substance.

For example, when $(V_{(1-x)}Cr_x)_2O_3$ is used as the first substance and ($TeCl_4$) is used as the transporting agent, a single crystal of $(V_{(1-x)}Cr_x)_2O_3$ can be obtained by an equilibrium reverse reaction shown in the chemical formula below. As shown in a reaction toward right direction in the following chemical formula, solid $(V_{(1-x)}Cr_x)_2O_3$ reacted with tellurium chloride ($TeCl_4$) is converted into gaseous $(V_{(1-x)}Cr_x)Cl_3$ which migrates in a quartz tube. The migrated gaseous $(V_{(1-x)}Cr_x)Cl_3$ shows a reaction toward left direction at a position of low temperature under temperature gradient applied, to cause re-crystallization of $(V_{(1-x)}Cr_x)_2O_3$. Thus, while repeating gasification and solidification, a crystal grows slowly, and a single crystal of 1 to 10 mm can be obtained. The size and quality of the resulting single crystal depend on the kind of a transporting agent, its density, setting of temperature gradient, preparation time and the like.

$$(V_{1-x}Cr_x)_2O_3(s) + \frac{3}{2}TeCl_4(s) \rightleftharpoons 2(V_{1-x}Cr_x)Cl_3(g) + \frac{3}{2}TeO_2(s)$$

In the thermistor device according to the present invention, the second layer may comprise a second substance having conductivity or semiconductivity. Examples of the second substance may include, but are not limited to, n-type semiconductive oxides such as ZnO, In—Sn oxide (ITO), $SrTiO_3$ and the like; p-type semiconductive oxides such as $SrCu_2O_2$, NiO, CuO, $La_xSr_{2-x}CuO_4$ (0<x<0.2), $EuTiO_3$ and the like; p- or n-type single element semiconductors such as Si and the like.

The second layer may have a thickness of 1000 nm or less, preferably 100 nm or less.

FIG. 2 shows a schematic view in measuring resistance of the thermistor device 1 of the present invention in FIG. 1. In FIG. 2, ohmic electrodes are formed on the first layer 2 and the second layer 3 of the thermistor device 1. On the first layer 2, an ohmic electrode 5 made of In is formed, and on the second layer 3, an ohmic electrode 6 made of Au is formed. The numbers 7 and 8 represent an electrode or electric wire, respectively.

A case in which the first substance constituting the first layer 2 has a positive temperature coefficient resistance property (PTCR property) will be described below.

When the first substance constituting the first layer 2 has a temperature lower than the so-called transition temperature $T_{M-I}$, the first substance is in metallic phase; thus, a potential barrier is not formed between the first layer 2 and the second layer 3, and resistance between the ohmic electrodes 5 and 6 depends on the resistance of the second layer, and manifests approximately the same value as resistance of the second layer. By controlling the thickness of the second layer, resistance of the thermistor device 1 under ON condition (low resistance condition) can be controlled.

On the other hand, when a temperature of the thermistor device exceeds the transition temperature $T_{M-I}$ by temperature rise, the first substance (thermistor substance) constituting the first layer 2 changes from being conductive to insulative. Resistance at the interface between the first and second layers (interface resistance) shows an ON/OFF ratio amplified by far more than the change in resistance of the thermistor substance. The reason why will be described: When the first substance (thermistor substance) changes to being semiconductive or insulative at the interface, a pn junction is formed in a case where the second substance is a semiconductor; or a schottky barrier is formed in a case where the second substance is a metal, in a range of several hundreds to several thousands Å from the interface. A very high potential barrier of about 0.5 to 2 eV is formed for electrons passing through the interface; thus, transfer of a carrier is inhibited, and apparent resistance increases.

FIG. 3 is a view showing the formation of a pn junction when the second substance is a semiconductor and the first substance shows insulativity or semiconductivity in reaching a temperature higher than the transition temperature $T_{M-I}$. In the condition shown in FIG. 3, electron transfer between C-B becomes difficult under reverse bias application, which dominates the whole resistance. Thus, as described above, the interface resistance is resistance of a thermistor device of the present invention, and a change in the resistance at or near the operation temperature (ON/OFF ratio) increases by far more than the ON/OFF ratio of the single first substance.

In the case of pn junction as shown in FIG. 3, potential barrier height depends on the applied voltage, which shows a positive correlation with actual resistance. Therefore, in the case of formation of an apparatus having a thermistor device of the present invention and a voltage control unit for controlling voltage applied to the device, potential barrier height can be controlled by the apparatus, namely, the ON/OFF ratio of the apparatus can be controlled.

The present invention will be illustrated further in detail by way of the following Examples, but the present invention is not limited to these Examples.

EXAMPLE 1

ZnO (thickness: 400 nm) was used as the second layer, and a $(V_{0.988}Cr_{0.011})_2O_3$ polycrystal was prepared by an arc melting process as the first layer on the ZnO, obtaining a $(V_{0.988}Cr_{0.011})_2O_3$/ZnO junction type thermistor device A-1. For this device A-1, a change in current-voltage property (I-V property) depending on temperature was measured.

The I-V property of the device A-1 is linear below the phase transition temperature ($T_{M-I}$=290 K) of $(V_{0.988}Cr_{0.011})_2O_3$, and shows non-linearity at 290 K or higher. FIG. 4 shows a result at 250 K as the I-V property of the device A-1 at 290 K or lower, and a result at 306 K as the I-V property at 290 K or higher, suggesting formation of a potential barrier at the interface between the first and second layers of the device A-1. In the I-V property of the device A-1, current passing through the interface is out of the ohmic property up to around 0.7 V at temperatures of 290 K or higher (for example, result at 306 K in FIG. 4), and non-linearity represented by $I=V^{\alpha}$ is shown. It is understood that current increases in an exponential function fashion against voltage up to an applied voltage of around 0.7 V, and a potential barrier of about 0.7 eV is formed at the interface, at temperatures of the phase transition point ($T_{M-I}$) or higher of this system.

COMPARATIVE EXAMPLE 1

$(V_{0.988}Cr_{0.011})_2O_3$ (thickness: 0.3 mm) used in Example 1 was used as a single body, giving a thermistor device A-2. In measurement of resistance of the device A-2, an alternating current 2 terminal method using a usual resistance bridge was used. FIG. 5 shows a graph comparing resistance-temperature curves of the device A-1 in Example 1 (● in FIG. 5) and the device A-2 in Comparative Example 1 (○ in FIG. 5).

FIG. 5 shows that the device A-2 shows a slight change in resistance at or near 290 to 293 K. On the other hand, the device A-1 shows a change in resistance of about one order of magnitude. Its change in resistance is generated steeply in a narrower temperature range (range of 2 to 3 K) as compared with conventional $BaTiO_3$-based PTC thermistors. This suggests that the thermistor device of the present invention is useful.

EXAMPLE 2

<Preparation of Raw Material Powder>

Since a commercially available $V_2O_3$ powder is oxidized and its stoichiometry deviation would be occurred during preservation, it was reduced by heating at 900° C. for 5 hours under a reducing atmosphere ($Ar:H_2$=95:5 (volume ratio)) to return to stoichiometric composition. The composition was confirmed by X-ray diffraction.

<Synthesis of Polycrystalline Powder>

Chromium nitrate nona-hydrate was weighed in stoichiometric amount (1 mol %), and mixed well with a reducing agent $V_2O_3$ powder by wet mixing using acetone so that V:Cr=99:1 (atom %). After mixing, the mixture was calcined at 900° C. for 10 hours under a reducing atmosphere (Ar: $H_2$=95:5 (volume ratio)), obtaining a polycrystalline powder by a solid phase reaction. Thereafter, the powder was mixed well again.

<Growth of Single Crystal>

0.6 g of the resulting polycrystalline powder and tellurium chloride ($TeCl_4$) as a transporting agent were added into a quartz tube having a total length of 200 mm with a diameter of 12.5 mm, and the tube was sealed under vacuum (approximately $1\times10^{-2}$ Pa). The amount of tellurium chloride was 5 mg per 1 $mm^3$ of the quartz tube volume. The temperature of a tubular furnace was set so that the temperature of one end of the quartz tube was 1050° C. and the temperature of another end was 950° C., and single crystals were grown by temperature gradient. Single crystals grown over one week were removed from the quartz tube, and washed with dilute hydrochloric acid to remove tellurium chloride adhered to the surface, obtaining a single crystals of $(V_{0.99}Cr_{0.01})_2O_3$.

<Production of Si Thin Film>

The single crystal obtained above was set on a sample stage of a vacuum chamber, and a mask was made with an aluminum foil to prevent formation of a thin film at unnecessary parts. The chamber was evacuated into approximately $1\times10^{-5}$ Pa, and a sample was heated at 400° C. for 1 hour. A n-Si thin film was deposited on the single crystal obtained above, by radio-frequency magnetron sputtering technique (Ar pressure: 1 Pa; RF power: 100 W) while keeping temperature, to obtain a device A-3 having a hetero structure.

<Evaluation>

A gold wire was adhered to the device A-3 having a hetero structure obtained above using a silver paste, to prepare a sample for measurement. The sample was fixed to a measuring system, and inserted into a liquid nitrogen vessel for each system, and temperature dependence of the I-V property was evaluated using natural temperature gradient in the liquid nitrogen vessel. Evaluation of the I-V property was carried out using a semiconductor parameter analyzer manufactured by Agilent Technology Inc. The obtained results are shown in FIGS. 6, 7 and Table 1. FIG. 7 and Table 1 show the I-V curve obtained in FIG. 6 fitted according to multinomial approximation.

TABLE 1

| | Voltage | | | | | | |
|---|---|---|---|---|---|---|---|
| | −3 V | −2 V | −1 V | 0.2 V | 1 V | 2 V | 3 V |
| Resistance Ratio | $6\times10^4$ | $3\times10^4$ | $2\times10^4$ | $8\times10^2$ | $8\times10^3$ | $5\times10^4$ | $4\times10^4$ |

FIG. 7 shows that the device A-3 has an operating temperature near 240 K, and the resistance ratio around this temperature is $6\times10^4$. Thus, it is understood that this example can provide a thermistor device having a large ON/OFF ratio at operating temperature.

Figure 1:
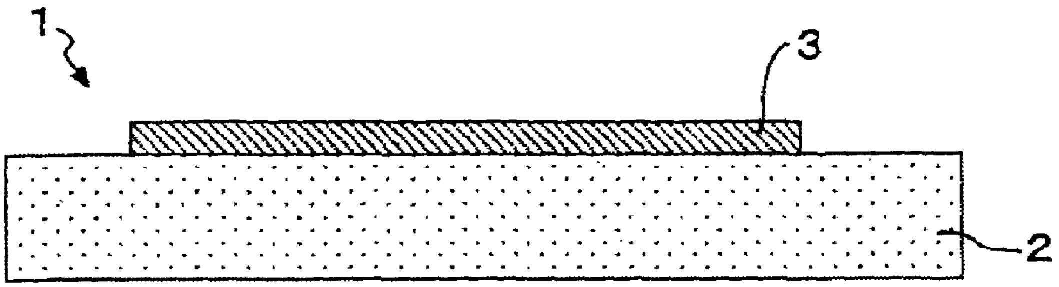
FIG. 1 shows a typical constitution example of a thermistor device according to the present invention.
Figure 2:
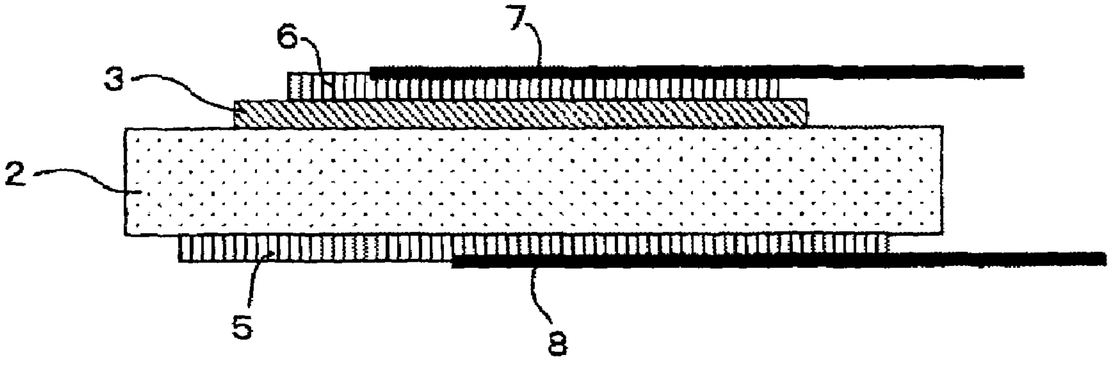
FIG. 2 is a schematic view in measuring resistance of the thermistor device 1 according to the present invention in FIG. 1.
Figure 3:
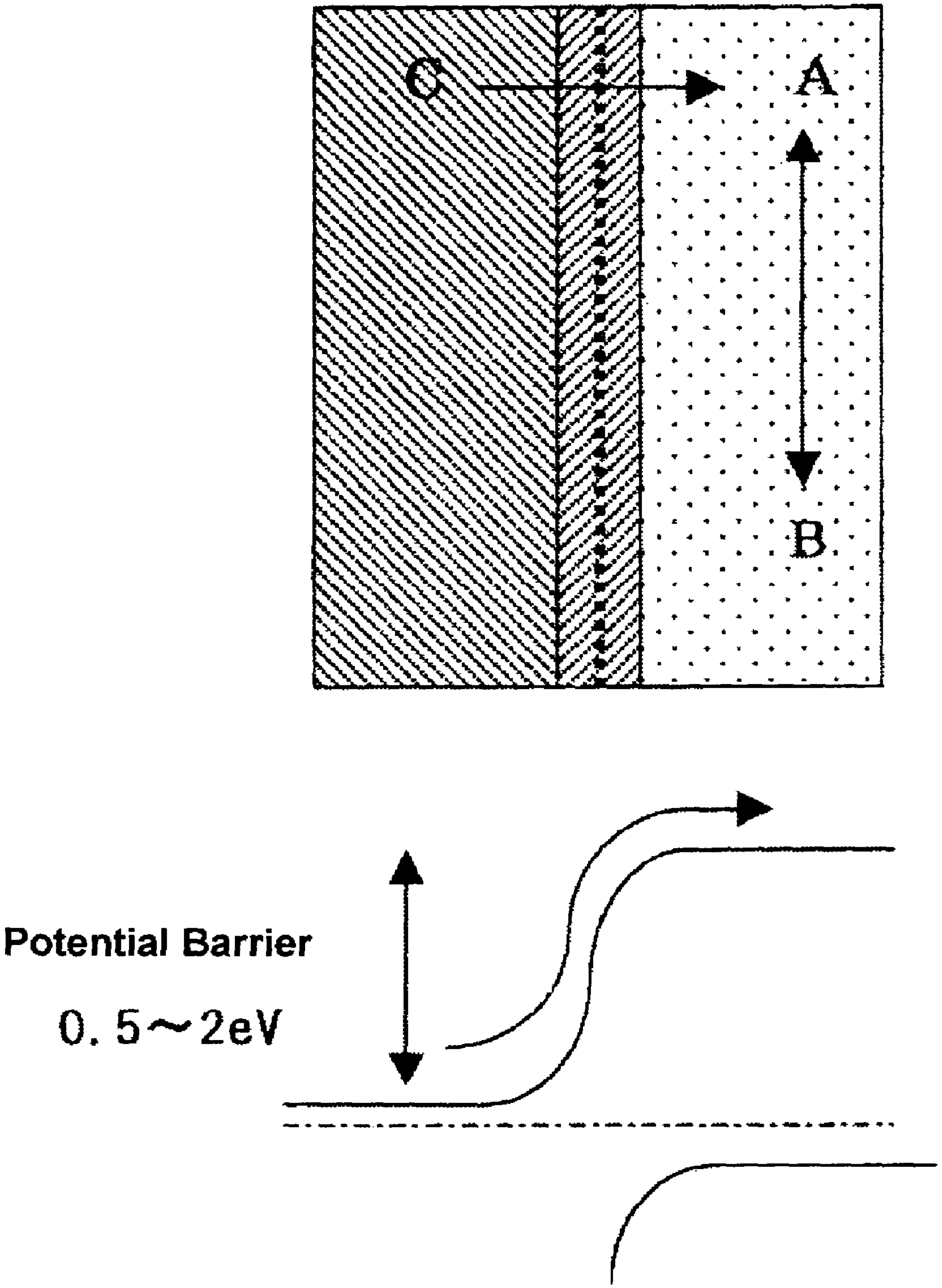
FIG. 3 illustrates formation of a pn junction according to one aspect of the present invention.
Figure 4:
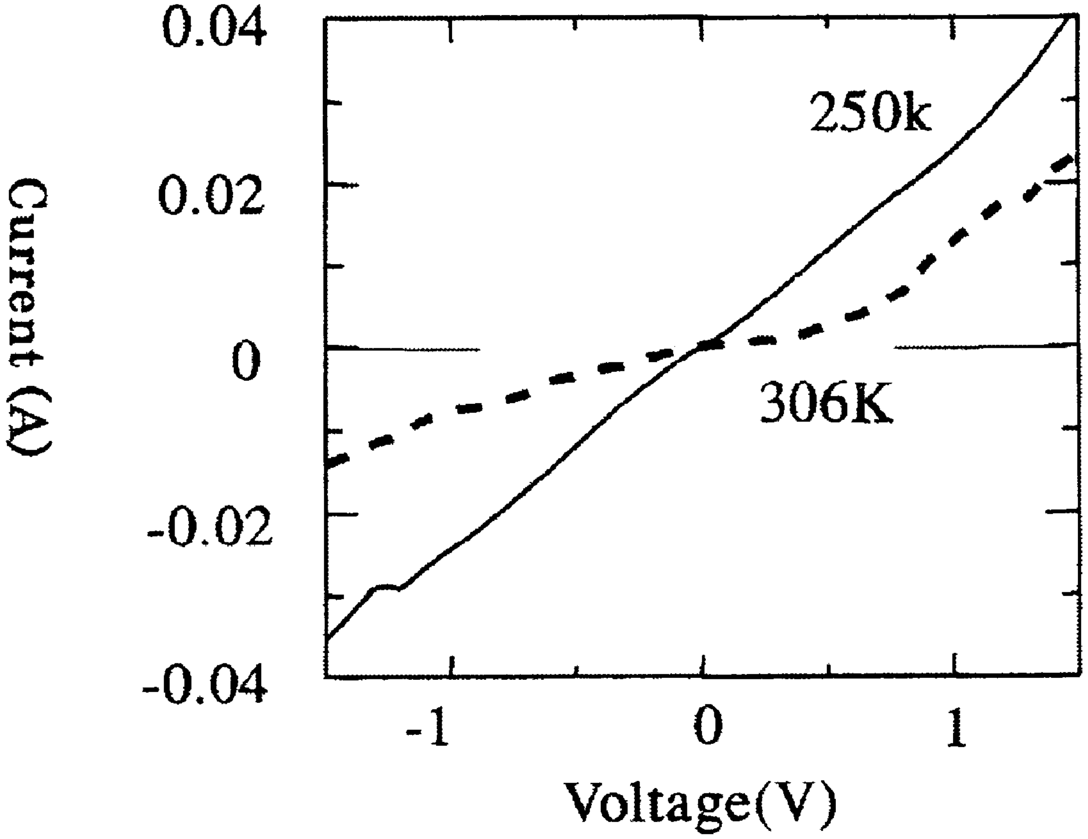
FIG. 4 shows a change in the temperature dependence of the current-voltage property (I-V property) of a device A-1 in Example 1.
Figure 5:
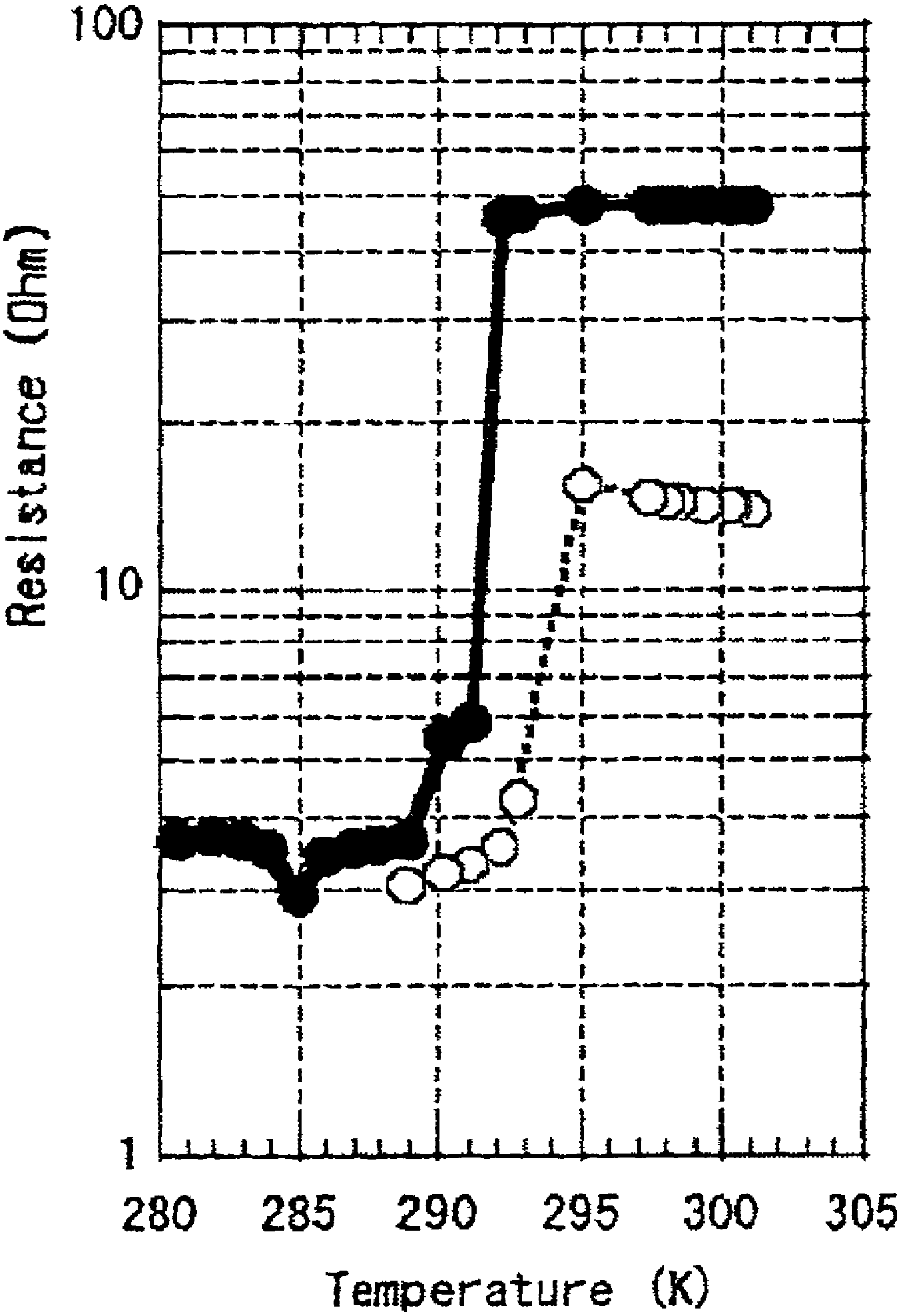
FIG. 5 is a graph comparing the resistance-temperature curves of the device A-1 in Example 1 and a device A-2 in Comparative Example 1.
Figure 6:
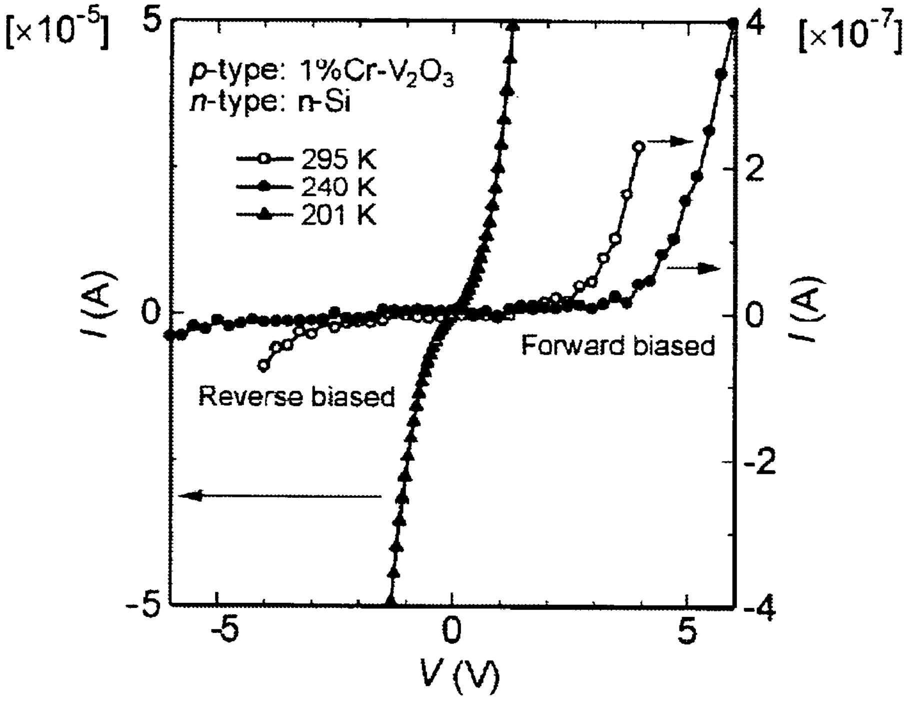
FIG. 6 shows a change in current-voltage property (I-V property) depending on temperature of a device A-3 in Example 2.
Figure 7:
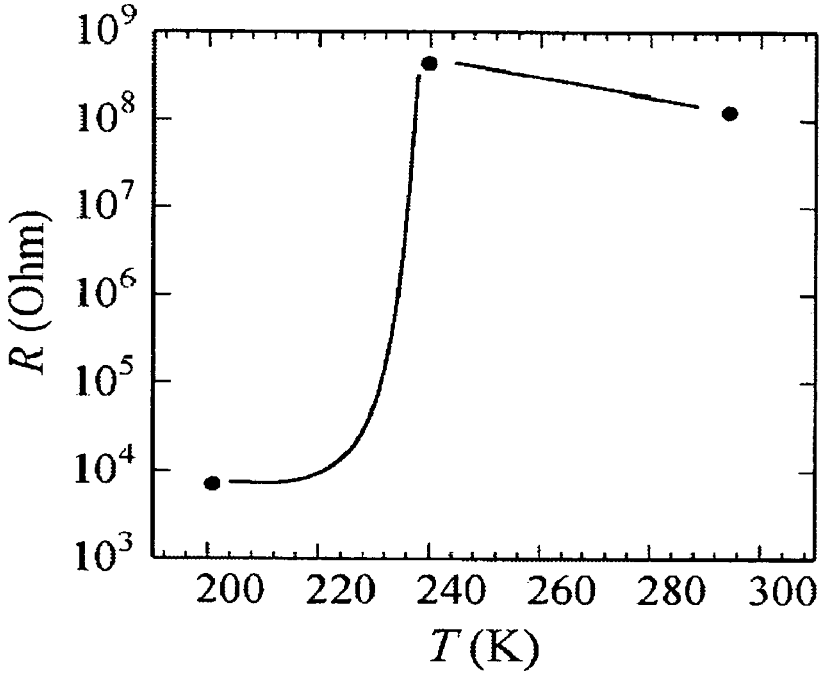
FIG. 7 shows a resistance-temperature curve of the device A-3 in Example 2.

What is claimed is:

1. A thermistor device comprising a first layer comprised of a first substance having a positive or negative temperature coefficient of resistance and a second layer comprised of a second substance having conductivity or semiconductivity and located directly on the first layer;

wherein said first substance is selected from the group consisting of vanadium oxides $(V_{(1-x)}M_x)_2O_3$ (M represents Cr or Ti, $0\leqq x\leqq 0.2$).

2. The device according to claim 1, wherein said first substance is a substance having a positive temperature coefficient of resistance and having 100 mΩcm or less at operating temperature or lower.

3. A thermistor device comprising a first layer comprised of a first substance having a positive temperature coefficient of resistance and a second layer comprised of a second substance having semiconductivity and formed directly on the first layer, wherein the interface between the first and second layers changes to a pn junction, as the first substance changes from being conductive to semiconductive or insulative at or near the transition temperature $T_{M-I}$;

wherein said first substance is selected from the group consisting of vanadium oxides $(V_{(1-x)}M_x)_2O_3$ (M represents Cr or Ti, $0\leqq x\leqq 0.2$).

4. The device according to claim 1, wherein said second substance is selected from the group consisting of n-type semiconductive oxides, p type semiconductive oxides and p- or n-type single element semiconductors.

5. The device according to claim 3, wherein said second substance is selected from the group consisting of n-type semiconductive oxides, p type semiconductive oxides and p- or n-type single element semiconductors.

6. The device according to claim 1, wherein said second layer has a thickness of 1000 nm or less.

7. The device according to claim 3, wherein said second layer has a thickness of 1000 nm or less.

8. A thermistor apparatus comprising a thermistor device and a voltage control means for controlling an applied voltage to the thermistor device, wherein said thermistor device comprises a first layer comprised of a first substance having a positive temperature coefficient of resistance and a second layer comprised of a second substance having conductivity or semiconductivity and located directly on the first layer;

wherein said first substance is selected from the group consisting of vanadium oxides $(V_{(1-x)}M_x)_2O_3$ (M represents Cr or Ti, $0 \leqq x \leqq 0.2$).

9. A thermistor apparatus comprising a thermistor device and a voltage control means for controlling an applied voltage to the thermistor device, wherein said thermistor device comprises a first layer comprised of a first substance having a positive temperature coefficient of resistance and a second layer comprised of a second substance having semiconductivity and located directly on the first layer, and the interface between the first and second layers changes to a pn barrier or a schottky barrier, as the first substance changes from being conductive to semiconductive or insulative at or near the transition temperature $T_{M-I}$;

wherein said first substance is selected from the group consisting of vanadium oxides $(V_{(1-x)}M_x)_2O_3$ (M represents Cr or Ti, $0 \leqq x \leqq 0.2$).

10. A thermistor device comprising a first layer comprised of a first substance having a positive temperature coefficient of resistance and a second layer comprised of a second substance having conductivity and located directly on the first layer, wherein the interface between the first and second layers changes to a schottky barrier, as the first substance changes from being conductive to semiconductive or insulative at or near the transition temperature $T_{M-I}$;

wherein said first substance is selected from the group consisting of vanadium oxides $(V_{(1-x)}M_x)_2O_3$ (M represents Cr or Ti, $0 \leqq x \leqq 0.2$).

11. The device according to claim 10, wherein said second substance is selected from the group consisting of n-type semiconductive oxides, p type semiconductive oxides and p- or n-type single element semiconductors.

12. The device according to claim 10, wherein said second layer has a thickness of 1000 nm or less.

13. A thermistor apparatus comprising a thermistor device and a voltage control means for controlling an applied voltage to the thermistor device, wherein said thermistor device comprises a first layer comprised of a first substance having a positive temperature coefficient of resistance and a second layer comprised of a second substance having conductivity and located directly on the first layer, and the interface between the first and second layers changes to a pn junction or a schottky barrier as the first substance changes from being conductive to semiconductive or insulative at or near the transition temperature $T_{M-I}$;

wherein said first substance is selected from the group consisting of vanadium oxides $(V_{(1-x)}M_x)_2O_3$ (M represents Cr or Ti, $0 \leqq x \leqq 0.2$).

* * * * *

UNITED STATES PATENT AND TRADEMARK OFFICE

CERTIFICATE OF CORRECTION

PATENT NO. : 7,709,922 B2
APPLICATION NO. : 10/594341
DATED : May 4, 2010
INVENTOR(S) : H. Takagi et al.

It is certified that error appears in the above-identified patent and that said Letters Patent is hereby corrected as shown below:

| **COLUMN** | **LINE** | |
|---|---|---|
| (75) Pg. 1, col. 1 | Inventors | "Hidenori Takagi, Tokyo," should read --Hidenori Takagi, Bunkyo,-- |
| 8 (Claim 1, | 35 line 8) | "$0 \leqq x \leqq 0.2$" should read --$0 \leq x \leq 0.2$-- |
| 8 (Claim 3, | 50 line 11) | "$0 \leqq x \leqq 0.2$" should read --$0 \leq x \leq 0.2$-- |
| 9 (Claim 8, | 16 line 10) | "$0 \leqq x \leqq 0.2$" should read --$0 \leq x \leq 0.2$-- |
| 9 (Claim 9, | 30 line 14) | "$0 \leqq x \leqq 0.2$" should read --$0 \leq x \leq 0.2$-- |
| 10 (Claim 10, | 9 line 11) | "$0 \leqq x \leqq 0.2$" should read --$0 \leq x \leq 0.2$-- |
| 10 (Claim 13, | 29 line 14) | "$0 \leqq x \leqq 0.2$" should read --$0 \leq x \leq 0.2$-- |

Signed and Sealed this

Tenth Day of August, 2010

David J. Kappos

*Director of the United States Patent and Trademark Office*